United States Patent [19]

Koskenmaki et al.

[11] Patent Number: 5,226,210
[45] Date of Patent: Jul. 13, 1993

[54] METHOD OF FORMING METAL FIBER MAT/POLYMER COMPOSITE

[75] Inventors: David C. Koskenmaki, St. Paul; Clyde D. Calhoun, Stillwater, both of Minn.; Pamela S. Tucker, Austin; Robert L. Lambert, Jr., Georgetown, both of Tex.

[73] Assignee: Minnesota Mining and Manufacturing Company, St. Paul, Minn.

[21] Appl. No.: 823,151

[22] Filed: Jan. 21, 1992

Related U.S. Application Data

[62] Division of Ser. No. 703,399, May 21, 1991, Pat. No. 5,124,198.

[51] Int. Cl.$^5$ ............................................. B21B 1/46
[52] U.S. Cl. .......................... 29/527.5; 179/35 MS; 428/256; 428/594; 428/608; 428/628
[58] Field of Search ................. 29/527.5, 527.1; 428/594, 608, 626, 138, 256, 373; 174/35 MS

[56] References Cited

U.S. PATENT DOCUMENTS 2,798,093  4/1974  Levine et al. .
3,087,233  4/1963  Turnbull .

(List continued on next page.)

FOREIGN PATENT DOCUMENTS 194406  9/1986  European Pat. Off. .
227131  7/1987  European Pat. Off. .

(List continued on next page.)

OTHER PUBLICATIONS

Donald E. Hudgin and Mohammad A. Semsarzadeh, "EMI Shielded High Performance Polymer Metal Blends," *Antec*, 1986, pp. 231-232.
Robert M. Simon, "EMI Shielding Can Be Made of Conductive Plastics," *Industrial Research & Development*, Jun. 1982, pp. 104-109.
Shield Hamilton, "EMI Shielding for Plastic Enclosures", *New Electronics*, Apr. 1987, pp. 22-23.
John T. Hoback and Jon J. Reilly, "Conductive Coatings for EMI Shielding," *Journal of Elastomers and Plastics*, vol. 20, Jan. 1988, pp. 54-69.
"Fibrex Web Resists Corrosion", *Elastomerics*, Feb. 1988, p. 45.
Robert P. Tolokan and John C. Nablo, "EMI Shielding Via Stainless-Steel Fibers", *Plastics Engineering*, Aug. 1985, pp. 31-39.
*Chemical Abstracts*, 99, No. 20: 159482z (Nov. 14, 1983).
*Chemical Abstracts*, 103, No. 22: 179255g (Dec. 2, 1985).
*Chemical Abstracts*, 104, No. 26: 22607a (Jun. 30, 1986).
*Chemical Abstracts*, 105, No. 4: 25366y (Jul. 28, 1986).
*Chemical Abstracts*, 105, No. 16: 134899v (Oct. 20, 1986).
*Chemical Abstracts*, 107, No. 10: 87996d (Sep. 6, 1987).
*Chemical Abstracts*, 107, No. 12: 107526f (Sep. 21, 1987).

*Primary Examiner*—Carl J. Arbes
*Attorney, Agent, or Firm*—Gary L. Griswold; Walter N. Kirn; Darla P. Neavill

[57] ABSTRACT

The present invention provides a metal/polymer composite comprising a polymeric substrate and a sintered mat of randomly-oriented metal fibers embedded therein, the fibers having a substantially circular cross-section and a diameter of about 10 to 200 μm. The polymeric substrate is typically a thin, flexible sheet-like material having a pair of planar surfaces. The polymeric substrate is preferably thermoformable. If thermoformability is desired the metal will have a melting point of less than the thermoforming temperature of the polymeric substrate. The thermoformable metal/polymer composite of the present invention may be stretched to at least 20%, and often can be stretched at least 200% of its original dimensions, at least in certain regions, without loss of electrical continuity or EMI shielding properties. The present invention also provides a method of making a metal/polymer composite and a sintered mat of randomly-oriented metal fibers.

11 Claims, 3 Drawing Sheets

U.S. PATENT DOCUMENTS

| | | | |
|---|---|---|---|
| 3,091,262 | 5/1963 | Donaldson . | |
| 3,410,936 | 11/1968 | Juras . | |
| 3,485,595 | 12/1969 | Kraft . | |
| 3,506,526 | 4/1970 | Toyooka . | |
| 3,556,914 | 1/1971 | Juras | 161/5 |
| 3,713,477 | 1/1973 | Kuniyasu et al. | 164/69 |
| 3,713,787 | 1/1973 | Kuniyasu et al. . | |
| 3,727,292 | 4/1973 | Nicely . | |
| 3,811,976 | 5/1974 | Schlomer et al. . | |
| 3,888,711 | 6/1975 | Breitner . | |
| 3,996,167 | 12/1976 | Brown . | |
| 4,001,357 | 1/1977 | Walz et al. | 264/12 |
| 4,107,363 | 8/1978 | Dawn et al. . | |
| 4,269,800 | 5/1981 | Sommer et al. | 264/111 |
| 4,642,244 | 2/1987 | Tripp, III et al. . | |
| 5,028,490 | 7/1991 | Koskenmaki | 29/527.5 X |

FOREIGN PATENT DOCUMENTS

| | | |
|---|---|---|
| 2057053 | 3/1979 | Fed. Rep. of Germany . |
| 2829035 | 1/1988 | Fed. Rep. of Germany . |
| 2186312 | 2/1974 | France . |
| 53/36061 | 9/1978 | Japan . |
| 56/34449 | 4/1981 | Japan . |
| 56/131665 | 10/1981 | Japan . |
| 57-04766 | 1/1982 | Japan . |
| 57-37462 | 8/1982 | Japan . |
| 57-135155 | 8/1982 | Japan . |
| 59-187847 | 10/1984 | Japan . |
| 60/132742 | 7/1985 | Japan . |
| 60/216453 | 10/1985 | Japan . |
| 60/231764 | 11/1985 | Japan . |
| 61/289200 | 12/1986 | Japan . |
| 62/122746 | 6/1987 | Japan . |
| 2189740 | 11/1987 | United Kingdom . |

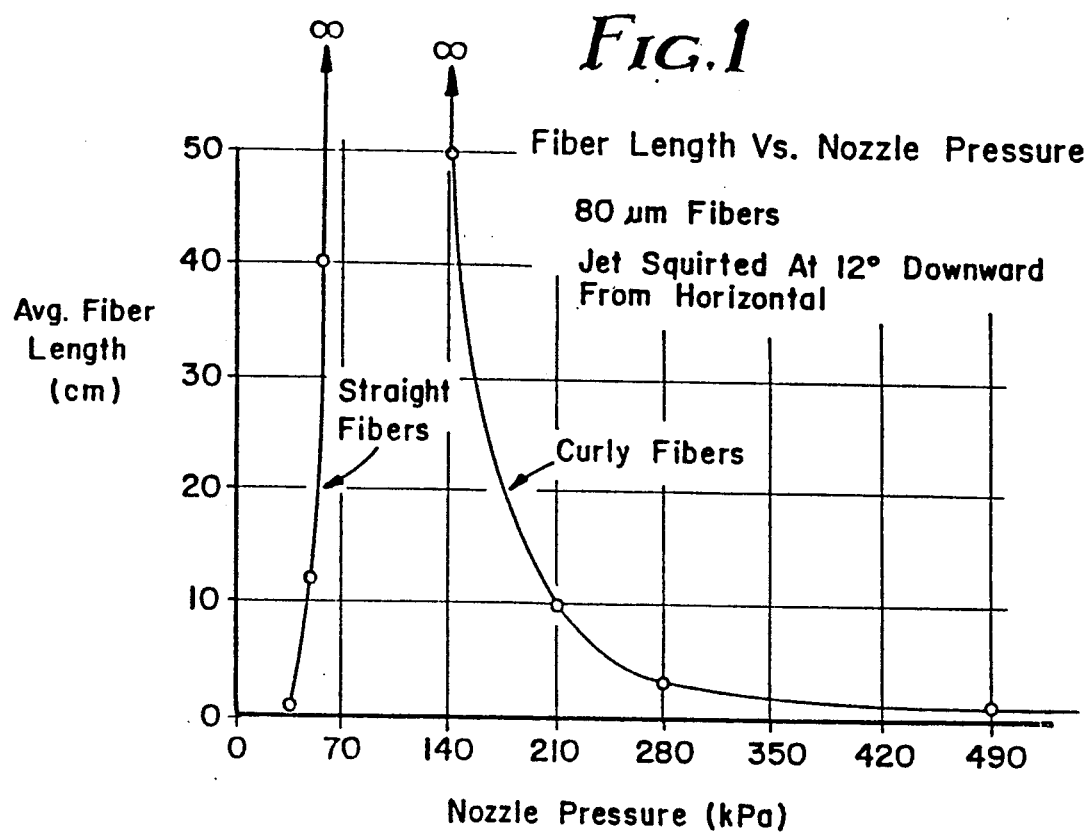
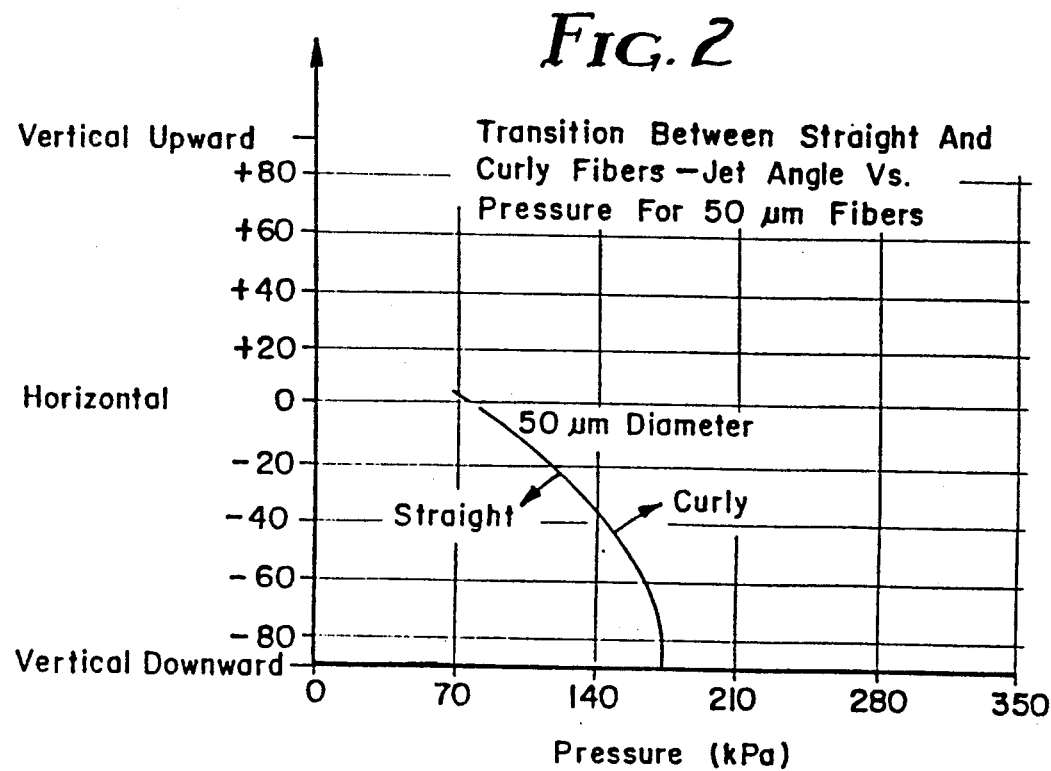

METHOD OF FORMING METAL FIBER MAT/POLYMER COMPOSITE

This is a division of application No. 07/703,399 filed May 21, 1991, now U.S. Pat. No. 5,124,198 issued Jun. 23, 1992.

Field of the Invention

This invention relates to non-woven mats of randomly oriented metal fibers, to metal/polymer composites formed with such mats, and particularly to thermoformable metal/polymer composites.

BACKGROUND OF THE INVENTION

A variety of metal and polymeric composites are known and used in many, varied applications. One important use for a metal/polymer composite is as a shield for electromagnetic and radio frequency waves. The interference caused by such waves in electronic devices is commonly referred to as electromagnetic interference (EMI) or radio frequency interference (RFI) (hereinafter jointly referred to as EMI). EMI shielding is often placed around an EMI source to prevent it from radiating EMI and interfering with surrounding devices. Also, the devices themselves may be provided with EMI shielding in an effort to shield the device from incoming electromagnetic (EM) radiation.

Another important use for a metal/polymer composite is for the protection of sensitive electronic parts from static charges. Static charge build-up can result from, for example, friction between surfaces, and can lead to a build-up of a high electrical potential. A sensitive electronic part that may come into proximity or contact with a statically charged surface can be destroyed or damaged During shipping or handling, shielding of an electronic part from static electricity can be accomplished by placing the part in an electrically conductive metal or metal/polymer container, with the metal providing a preemptive surface to drain away any static charge.

Many applications require that the shielding be thermoformed into a particular shape or structure. A thermoforming process comprises heating the material and forming it into a desired shape. For example, thermoforming is used to make various types of containers or housings. Thermoforming is usually accomplished by heating a thermoplastic sheet above its softening point, and forcing it against a mold by applying vacuum, air, or mechanical pressure. On cooling, the contour of the mold is reproduced in detail.

Metal is a well-known effective shield against EMI or static charges Metal/polymer composites having continuous coatings of metal are known. Continuous metal coatings are typically deposited by vapor deposition, sputtering, plating or the like. To obtain coatings sufficiently thick to provide good electrical conductivity, these methods are time consuming and relatively expensive. Metal is also relatively heavy compared to polymeric materials, and therefore, where weight is a factor the amount of metal is desirably reduced.

As an alternative to continuous metal coatings, high loadings of short, straight, staple metal fibers have been used in EMI shielding In such EMI shielding the effectiveness of the shield is related to the dimensions of the spaces between the metal fibers. Contrary to what might commonly be expected, the amount of EMI that passes through a given void is dependent on the length of the void's longest dimension, and not on the total area of the void. For illustration, a 1.0 mm by 1.0 mm void (area 1.0 mm$^2$) is believed to let less EMI pass through than would a 3.0 mm by 0.05 mm void (area 0.15 mm$^2$) even though the 1.0 mm$^2$ space has greater than six times the area of the 0.15 mm$^2$ space. This is sometimes referred to as the "slot effect."

Accordingly, even extremely thin openings, such as those between mating parts, must be avoided where the void or opening has a substantial longitudinal dimension. To accomplish this end, it is desirable that the surfaces of EMI shielded enclosures include conductive coatings. An enclosure can be effectively sealed without leaving thin cracks between adjacent enclosure parts (e.g. a box and a box lid), by providing conductive surfaces on adjacent surfaces of the shielded enclosure. For this reason fibers, particles, or flakes of metal extruded or laminated into bulk polymer are not optimally effective unless the metal is distributed throughout the polymer to specifically include the sealing surfaces.

The effectiveness of EMI shielding is also directly related to the overall electrical conductivity of the polymer or the polymer coating, i.e., higher electrical conductivity gives better EMI shielding. When electrical conductivity is obtained by mixing conductive fibers into a polymer or by forming a coating of such fibers, the overall conductivity is dependent on the conductivity of the individual fibers and the amount of contact between the fibers. Short staple fibers require higher bulk loading, or for coatings, higher surface concentrations to obtain sufficient contact between the fibers. The number of contacts is significantly reduced during the thermoforming process, reducing the effectiveness of the EMI shielding.

Electrical conductivity can be enhanced by forming pressure welds or sintered bonds between the fibers, but the overall flexibility and ductility of a welded fiber mat is then reduced. A sintered or otherwise bonded metalfiber/polymer composite sheet loses its ability to be thermoformed except at thermoforming stresses sufficient to break the bonds between the fibers, allowing the fibers to slip past one another. However, when the bonds between fibers are broken, the electrical conductivity and EMI or static shielding properties of the composite are drastically reduced.

Electrical conductivity could be enhanced by using longer fibers that would require fewer fiber-fiber contacts to maintain continuous electrical conductivity. However, metal fibers in their solid state stretch very little, if at all, under conditions used for thermoforming polymers. Therefore, the fibers must slip relative to the polymer to keep from breaking during thermoforming. Curly fibers in their solid state may accomodate some of the strain by straightening, but there is still a slip component of the fiber relative to the polymer matrix as the fiber changes its shape during deformation of the polymer matrix. The net effect of this slip is a dramatic increase in the thermoforming stress needed for plastic flow of the composite. In addition, at concave surfaces or corners the fibers may pop out of the surface.

Accordingly, there is a need for a thin metal/polymer composite for use as a conductive coating, the composite including metal fibers to give efficient electrical conductivity for the conductive coating. For EMI shielding the coating will have a uniform coverage of metal fibers in all planar directions so as to not have voids, especially long narrow voids, that allow EM radiation to leak through the coating. There is also a need for a conductive coating that includes a mat of fine metal fibers having sufficient voids to be transparent, the coating providing static shielding. There is also a need for such a metal/polymer composite to be thermoformable without loss of electrical continuity, or EMI or static shielding properties.

There is a further need for an economical and simple method of making a non-woven metal mat of randomly-arranged, fine metal strands that can be sintered and/or embedded into a polymeric substrate for use as an EMI shield. It may also be desirable for the metal strands to be curly, forming an entangled self-supporting web.

SUMMARY OF THE INVENTION

The present invention provides a metal/polymer composite comprising a polymeric substrate and a sintered mat of randomly-oriented metal fibers embedded therein, the fibers having a substantially circular cross-section and a diameter of about 10 to 200μm. The polymeric substrate is typically a thin, flexible sheet-like material having a pair of planar surfaces. The polymeric substrate is preferably thermoformable. If thermoformability is desired the metal will have a melting point of less than the thermoforming temperature of the polymeric substrate. The thermoformable metal/polymer composite of the present invention may be stretched to at least 20%, and often at least 200% of its original dimensions, at least in certain regions, without loss of electrical continuity or EMI shielding properties.

The present invention also provides a method of making an entangled, non-woven mat of fine, randomlyoriented metal strands, comprising the steps of: a) squirting a fine stream of molten metal from one or more orifices into an atmosphere; b) solidifying at least one molten metal stream in an atmosphere as metal strands; and c) collecting the solidified metal strands on a support to form a non-woven mat of a randomly-intersecting pattern of metal strands. The loose mat may be passed between two heated rollers at a temperature less than the melting temperature of the metal to sinter the strands of metal together at the points of intersection to form a sintered mat. If it is desirable that the fibers be of a randomly-serpentine or curly configuration, the fibers are squirted from the orifices at a pressure greater than $P_c$, the transition pressure between straight and curly fibers.

Alternatively, the non-woven mat of randomly-oriented metal strands may be collected directly on a polymeric substrate. The non-woven mat and substrate may be passed between heated rollers to simultaneously embed the mat into the substrate and sinter the strands of metal together at the points of intersection. Also, the sintered mat may be formed separately and laminated to a polymeric substrate at a temperature below the melting temperature of the metal, but at a temperature and pressure sufficient to embed the metal mat into the surface of the polymer. Metal mats may also be embedded on both planar surfaces of a thin sheet-like polymeric substrate.

As used herein, "sintered" means the joining together of two metals at a temperature below the melting points of the two metals.

BRIEF DESCRIPTION OF THE DRAWINGS

FIG. 1 is a plot of the average fiber length in centimeters versus nozzle pressure.

FIG. 2 is a plot of jet-angle versus pressure demonstrating the transition between straight and curly fibers.

DETAILED DESCRIPTION OF THE INVENTION

The present invention provides a method of making random, non-woven metal mats comprising fine metal strands. The loose metal fibers may be sintered at their points of intersection by passing the metal mat between heated rollers to form a sintered metal mat. The present invention also provides a metal/polymer composite comprising one or more sintered metal mats embedded in a polymeric substrate. Such a metal/polymer composite is useful for EMI shielding, and is preferably thermoformable.

Referring to FIG. 1, a plot of the average fiber length, in cm, versus nozzle pressure is shown. The molten metal is squirted through an orifice that has an internal diameter (I.D) of 80 μm and the nozzle was held at a 12° downward position from horizontal. As is shown in FIG. 1, as the nozzle pressure increases, the length of the straight fiber formed increases rapidly, forming a continuous fiber at less than 69 kPa. As the pressure is increased, long curly or serpentine fibers begin to form at a transition pressure $P_c$ of 138 kPa. $P_c$ will vary greatly depending on the process parameters of the system. For example, $P_c$ will vary with the metal used, the ambient temperature of the atmosphere, the size of the orifice, and other factors.

As is shown in FIG. 2, the angle of the jet is important in determining at what pressure the transition between straight and curly fibers will occur. As shown in FIG. 2 as the angle of the jet is increased downward from the horizontal, the pressure necessary to produce a curly fiber of the invention is also increased.

Figure 3:
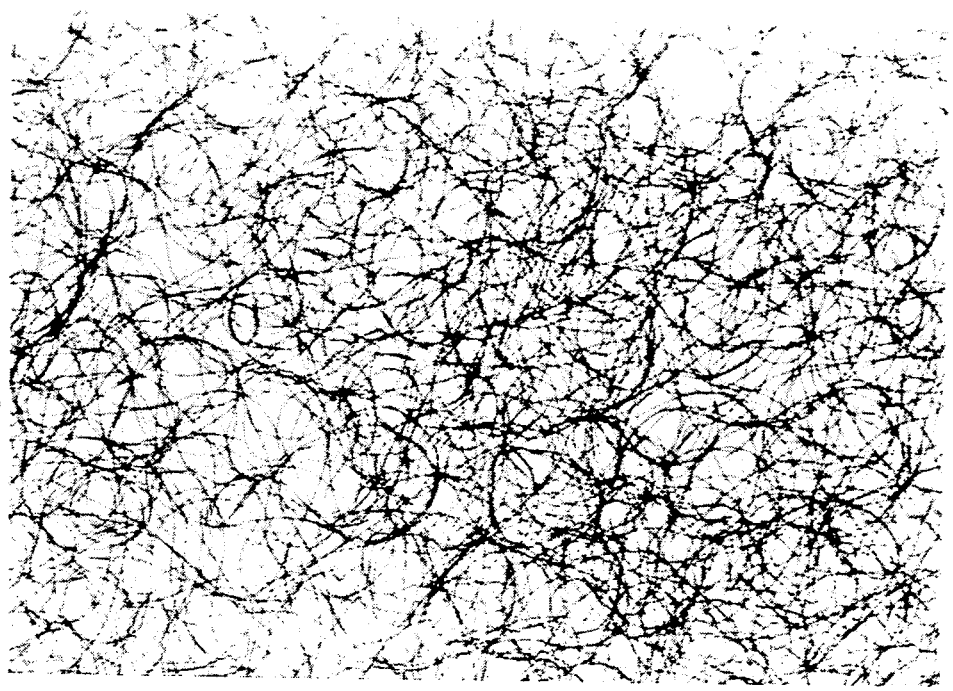
FIG. 3 is a photograph depicting a loose mat of the present invention.

Referring to FIG. 3, a photograph depicting a loose mat of the present invention is shown. The fibers of the loose mat shown in FIG. 3 are straight fibers formed by squirting a metal from the plurality of orifices at a pressure less than $P_c$. The fibers of the mat shown in FIG. 3 were formed by squirting a 58 wt % bismuth, 42 wt % tin-alloy from orifices having a diameter of 50 μm at a pressure of 100 kPa.

Figure 4:
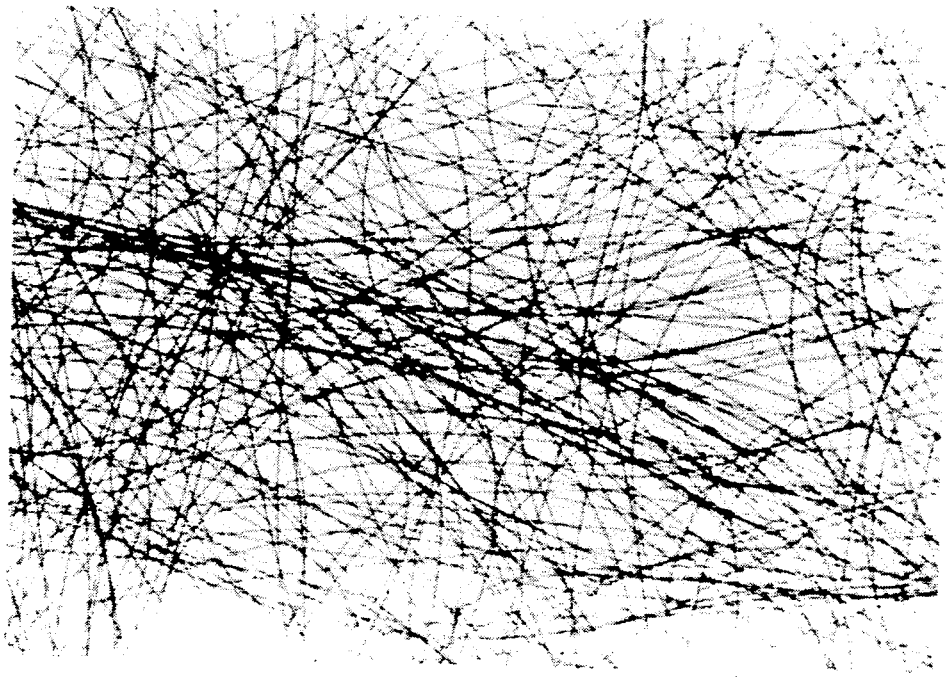
FIG. 4 is a photograph depicting a loose mat of the present invention.

Referring to FIG. 4, a photograph depicting an entangled mat of the present invention is shown. The fibers depicted in FIG. 4 are randomly-serpentine or curly in nature having been squirted from a plurality of orifices at a pressure greater than $P_c$. The fibers shown in FIG. 4 were formed by squirting the same bismuth-tin-alloy as described for FIG. 3, from a plurality of orifices having a diameter of 50 μm at a pressure of 200 kPa.

Figure 5:
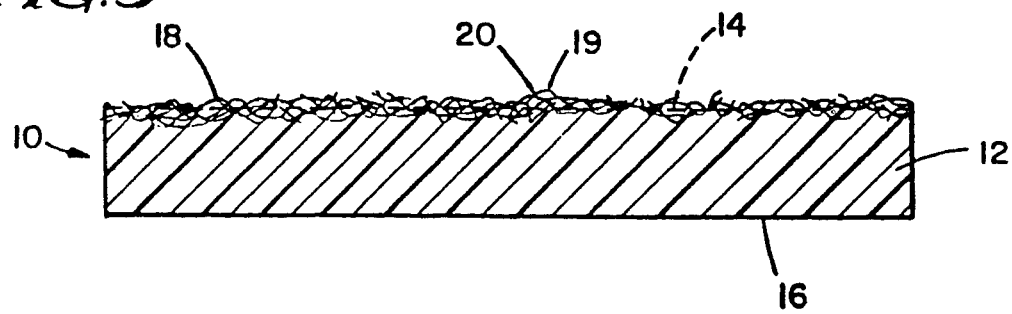
FIG. 5 is a schematic cross-section of a metal/polymer composite of the present invention.

Referring to FIG. 5, a schematic cross-section of a metal/polymer composite of the present invention is shown. A metal/polymer composite 10 is shown having a sheet-like polymeric substrate 12 having planar surfaces 14 and 16. Embedded in planar surface 14 is a sintered mat of metal fibers 18 comprising individual fibers 19 sintered together at points of intersection 20.

Figure 6:
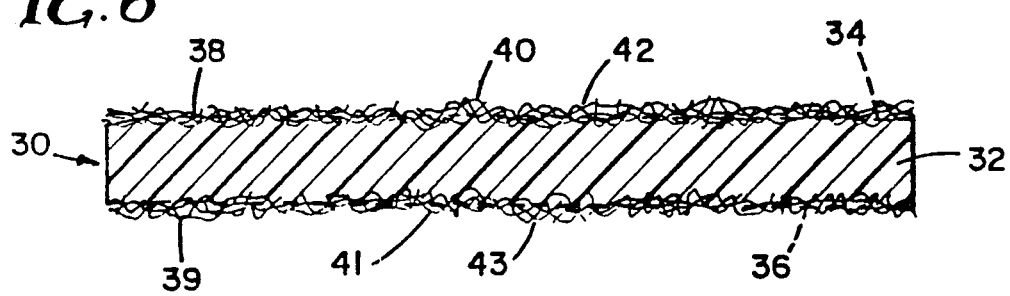
FIG. 6 is a schematic cross-section of a metal/polymer composite of the present invention.

Referring to FIG. 6, a schematic cross-section of a metal/polymer composite of the present invention is shown. The composite 30 comprises polymeric substrate 32 having planar surfaces 34 and 36. Embedded in the surfaces 34 and 36 are sintered metal mats 38 and 39. The metal mats 38 and 39 each comprise a plurality of individual fibers 40 and 41 sintered together at points of intersection 42 and 43, respectively.

Figure 7:
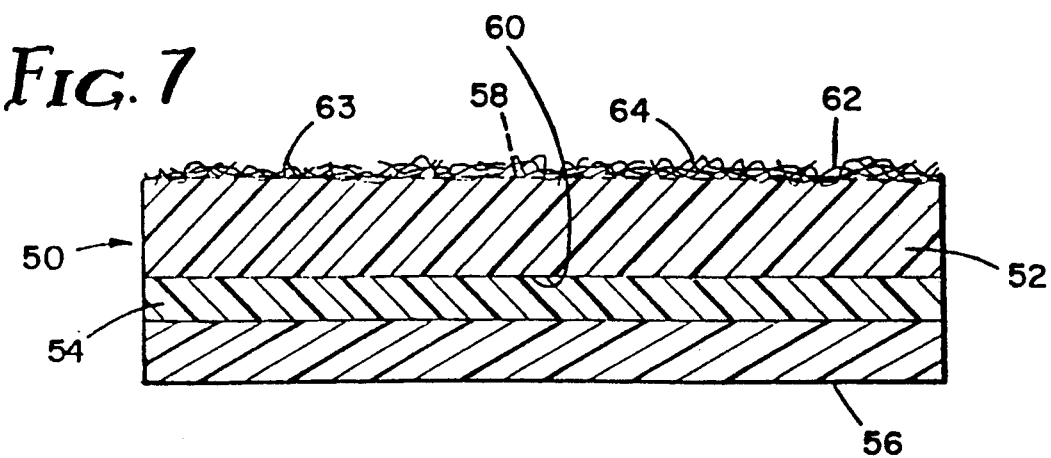
FIG. 7 is a schematic cross-section of a metal/polymer composite of the present invention.

Referring to FIG. 7, a metal/polymer composite of the present invention is shown. A metal/polymer composite 50 comprises a polymeric embedding layer 52, a second polymeric layer 54, and an optional third polymeric layer 56. The polymeric layer 52 has planar surfaces 58 and 60. Embedded in the surface 58 is a sintered metal mat 62. The second polymeric layer 54 adheres the surface 60 to the third polymeric layer 56. The sintered metal mat 62 is comprised of individual fibers 63 sintered at points of intersection 64.

Polymers

The polymeric embedding layer used in conjunction with the mat of randomly-oriented metal fibers may be selected from a wide variety of polymeric materials, dependent on the desired end use of the metal/polymer composite. The polymeric embedding layer is typically a thin, sheet-like material having a pair of planar surfaces. The polymeric embedding layer may also comprise non-woven or woven polymeric fibers, or other configurations of polymeric materials. The embedding layer may also comprise a polymeric layer provided on another material such as ceramic, glass, metal or another polymer.

It is preferable that the polymeric substrate be easily attached to the mat of metal fibers by embedding the mat into the polymer. The mat of metal fibers may be embedded into a polymeric substrate, such as by heating the polymeric substrate to a softened condition and laminating the mat and substrate together. The mat is preferably partially embedded into a polymeric sheet, leaving exposed metal extending from the surface. The exposed metal provides a conductive surface on the polymeric substrate.

The polymeric substrate is preferably thermoformable. A wide variety of polymeric sheet materials are thermoformable. A sheet material which is useful for thermoforming will typically have a significant melt strength. The strength of the sheet material will allow it to be shaped by low pressures and at the same time will prevent excessive sagging. Other desirable properties are low shrinkage on cooling and a wide thermoforming temperature range. Most other properties are determined by the end use and the properties necessary in the finished product.

Suitable thermoformable sheet materials include: polystyrene, particularly high-impact polystyrene; cellulosic materials, such as, cellulose acetate, cellulose-acetate-butyrate (CAB), and cellulose propionate; acrylonitrile-butenate-styrene polymers (ABS); olefin polymers, such as high-density polyethylene, low-density polyethylene, ethylene-butene copolymer, ethylene-vinyl acetate copolymers, polypropylene, and polypropylene copolymers; methylmethacrylate polymers, including poly(methyl methacrylate), methyl methacrylate-acrylonitrile copolymer (such as, XT polymer, manufactured by American Cyanamide) and acrylic-modified poly(vinyl chloride) (such as, Kydex, commercially available from Rohm and Hass Company); polycarbonate; vinyl chloride polymers, including poly(vinyl chloride-co-vinyl acetate), poly(vinyl chloride); polysulfones; and polyamides.

The thermoforming process may stretch the heated substrate, for example, to at least 50 percent, and often, at least 200 percent of its original dimensions, at least in certain regions of the polymeric sheet. For example, stretching of the substrate may be greater around corners than on planar surfaces.

To allow thermoforming of the metal/polymer composite without loss of electrical continuity or EMI shielding properties, the melting point of the metal is less than the thermoforming temperature of the polymeric substrate. The thermoforming temperature of a particular polymer is a temperature, or range of temperatures, that is determined by one skilled in the art, and is often suggested in product literature of the manufacturer.

A wide variety of additional polymers may be used where thermoformability is not required.

There are useful and desirable polymeric substrates, including substrates that are capable of being thermoformed, that are not readily attached to a sintered metal mat by embedding the metal mat into the particular polymeric substrate. In such cases a separate polymeric layer to which the metal readily attaches may be used as the embedding layer. If the embedding layer does not readily attach to the desired polymeric substrate, a second polymeric layer or tie layer may be used to adhere or bond the sintered metal mat/polymeric embedding layer composite to the desired polymeric substrate or layer. The second polymeric layer or tie layer may also be used to bond the sintered metal mat/polymeric embedding layer composite to a non-polymeric substrate such as metal, glass, or a ceramic material.

Materials useful as a second polymeric layer or tie layer include, copolymers of polyethylene, such as poly(ethylene-acrylate), poly(ethylene-methacrylates), poly(ethylene-vinyl acetate), poly(ethylene-vinyl alcohol); graft polymers of polypropylene, such as, poly(propyleneacrylate); poly(propylene-maleic anhydride); functionalized polyethylene (a functional group incorporated in the polyethylene backbone); ionomeric resins; copolyesters, such as those based on 1,4 butandiol and terephthalic acid and/or isophthalic acid, adipic acid or sebacic acid; thermoplastic polyurethanes; block copolymers, such as poly(styrene-butadiene), poly(styrene-isoprene), poly(styrene-ethylene-butylene), including diblocks, triblocks, or starblock copolymers; and poly(butadiene-nitrile) copolymers.

Metals

A wide variety of metals may be used. Where thermoformability is desired, a metal having a melting point of less than the thermoforming temperature of the polymer is utilized. During thermoforming the metal melts and is distorted along with the polymer substrate. As it is stretched the molten metal strands retain continuity, and thus, electrical conductivity.

Depending on the metal/polymer system and processing parameters, the overall fiber shapes and fiber positions relative to the polymeric substrate can be retained during biaxial strains of the substrate that exceed 200% measured linearly in two perpendicular directions in the plane of the substrate. The metal in the molten state is able to flow with the adjacent substrate, and therefore, there is no slip of the fibers relative to the polymer surface contacting the fibers. Fiber-fiber contacts remain intact and are fused together, improving electrical conductivity. Beyond a certain limit of strain, which depends on the metal/polymer system and processing conditions, the surface tension of the molten metal fiber surfaces causes the metal in the fiber to bead up with loss of electrical continuity.

Examples of preferred metals for use in the composite of the present invention include tin, lead, bismuth, cadmium, indium, gallium, mixtures thereof, and their alloys, including alloys containing metals with higher melting points, selected from the group consisting of zinc, aluminum, copper, silver, gold, nickel, cobalt, and iron.

The metals or metal alloys are preferably utilized in a substantially pure form. It is unnecessary, and often undesirable, to include polymeric binders that are found, for example, in metal inks, or other fillers or additives. The metal is squirted in a molten state through a fine orifice, such as a capillary or hypodermic needle. Therefore, it is preferable that the metal not include substances which could clog or otherwise hamper the flow of the typically fine jet of metal.

Method

The present invention provides a method of making metal/polymer composites that comprise, in general, a polymeric substrate and a sintered mat of randomly oriented metal strands embedded therein, the strands having a substantially circular cross-section and a diameter of about 10 to 200 $\mu$m. The polymeric substrate is typically a thin flexible, sheet-like material, and is preferably thermoformable. The polymeric substrate with the sintered metal mat embedded therein may be bonded or adhered to another polymeric layer or a non-polymeric substrate by means of an additional polymeric layer used as a tie layer.

The method of the present invention includes, in general terms: (a) forming the fine metal strands, (b) collecting the fine metal strands in a randomly-oriented configuration, (c) sintering the randomly oriented metal strands, and (d) optionally embedding the sintered mat of fine metal strands into the polymeric substrate. Steps (c) and (d) may be done simultaneously.

The metal strands may be collected on a surface, such as a release surface, and passed through heated rollers under pressure to form a sintered mat of the fine metal fibers. After sintering the metal mat may be laminated to the polymeric substrate to form the metal/polymer composite of the present invention. Alternatively, the metal strands or fibers may be collected directly on the surface of the polymeric substrate. The polymeric substrate and loose mat of randomly-oriented metal strands are then passed between heated rollers under pressure to simultaneously sinter the metal strands and embed them in the surface of the polymeric substrate.

It may be desirable that the metal fibers be of a curly or serpentine nature, causing increased entanglement of the fibers as they are collected. An entangled mat as collected will be substantially integral, i.e., able to be handled as a web.

The entangled or loose mat may be passed between two heated rollers at a temperature that is less than the melting temperature of the metal, to form a sintered mat. The strands of metal are sintered together at the points of intersection. The sintered mat typically is self-supporting and flexible and may be useful in a number of end uses. The entangled mat will have a loft thickness of about 0.5 cm to 3.0 cm. The sintered mat has a gauge thickness of about 50–400 $\mu$m.

The present invention provides a simple and economic method for producing metal fibers, having a circular cross section and a diameter of about 10-200 $\mu$m, preferably 25-100 $\mu$m. These fibers may be generally straight or extremely curly, depending on certain process parameters.

The invention will be further exemplified by the following non-limiting examples.

EXAMPLE 1

A metal fiber mat of the invention was made as follows: A 14 mm by 45 cm quartz tube was heated at one end and pulled to form a closed off capillary. The closed off capillary was carefully ground using #400 grit abrasive paper until a hole having an internal diameter (I.D.) of 80 $\mu$m was opened. The tube was wrapped and then heated to about 200° C. with a resistance heating tape, manufactured by Sybron/Thermolyne. After the tube was heated, 300 grams of 75 wt % tin, 25 wt % bismuth, molten alloy (250° C.) was poured into the tube, the tube oriented with the nozzle end pointing down The upper end was closed off and pressurized to 207 kPa using argon gas. A molten metal jet formed which solidified roughly 1 m from the end of the nozzle. The resulting metal fibers were gathered on a piece of cardboard until the cardboard was covered to a uniform depth of 1.25 cm with entangled curly fibers. The entangled fiber mat was then fed into a laminator having two 15 cm diameter by 30 cm wide rolls heated to 135° C. The laminator rolls rotated at 2 rpm giving a surface speed of 1.5 cm/sec. The upper roll had a rubber outer sheath while the lower roll was steel. The two rolls were pressed together with a total force of roughly 900 Newtons. The metal fibers did not stick to either roller and only one pass was necessary to form a self-supporting sintered mat. The mat was 22 cm by 30 cm and weighed 8.3 grams.

EXAMPLE 2

A metal/polymer composite of the invention was made as follows: a 14 mm by 92 cm quartz glass tube was heated at its midpoint using an oxygen-acetylene torch and then pulled apart and pinched off to make two tubes approximately equal in length each having an end with an inside diameter tapered down to a sealed capillary. The capillary end of one tube was then carefully reopened by abrading it with #400 grit abrasive paper until the capillary had an orifice opening of 70 $\mu$m (I.D.). The tube was then wrapped with a resistance heating tape (manufactured by Thermolyne Corp) and electrically heated to approximately 200° C. The tube was mounted vertically with the orifice end down and 300 g of a molten alloy of (200 degrees C.) 55 wt % bismuth, 39 wt % tin, and 6 wt % zinc was poured into the top end of the tube. The top end of the tube was inserted into a rubber hose containing flowing argon gas and then clamped and pressurized to 200 kPa. A jet of molten metal formed at the capillary end of the tube and solidified about 1 meter below the tube to form metal fibers. The metal fibers were collected on a flat sheet of 20 cm by 30 cm by 500 $\mu$m thick PETG, copolyester 6763, manufactured by Kodak. The PETG sheets were moved back and forth under the fiber stream to deposit the metal fibers at a uniform thickness. Seven samples of varying metal fiber thicknesses were collected.

The samples were hot rolled through a laminator with rolls heated to 130° C. The laminator had 15 cm diameter by 41 cm rolls and was operated at a roll surface speed of 1 m/min and with a force of roughly 2000 Newtons pressing the rolls together. To keep the PETG from sticking to the rolls, the rolls were covered with sheets of 25 μm thick polyimide (Kapton H film manufactured by DuPont) prior to laminating. During laminating, the metal fibers were embedded into the surface of the PETG sheets.

The samples were heated for 80 seconds in an oven at 300° C. immediately prior to thermoforming, except for the seventh sample, which, due to its heavier density of metal fibers, was heated for 120 seconds. The metal fibers were on the outside surface away from the mold, except for sample #4. The samples were thermoformed using a male mold which formed a square depression in the sample 10 cm by 12 cm by 2 cm deep and which stretched the PETG by at least 200% in two planar directions at the corners of the mold. The thermoformed samples were then tested for EMI shielding effectiveness following a procedure similar to ASTM test ES7-83. The results are summarized in Table 1.

TABLE 1

| Sample | Sample fiber loading g/m$^2$ | dB at | | | |
|---|---|---|---|---|---|
| | | 30 MHz | 100 MHz | 300 MHz | 1000 MHz |
| 1 | 130 | 48 | 48 | 52 | 47 |
| 2 | 177 | 48 | 51 | 57 | 49 |
| 3 | 226 | 48 | 53 | 58 | 51 |
| 4 | 242 | 48 | 55 | 58 | 44 |
| 5 | 339 | 48 | 54 | 63 | 55 |
| 6 | 484 | 48 | 55 | 58 | 43 |
| 7 | 565 | 48 | 55 | 63 | 68 |

EXAMPLE 3

A composite of the invention was made as follows: about 300 g of a molten alloy (250° C.) of 57 wt % bismuth and 43 wt % tin was poured into a quartz tube similar to that used in Example 1 except that the orifice was 50 μm (I.D.). The tube was pressurized to 275 kPa and the resulting fibers were collected on a piece of cardboard. Under these conditions the fibers are curly and tended to entangle with one another so that when collected to a depth of at least 1 cm on a cardboard surface the resulting mat had sufficient strength so that it could be slid intact into a laminator without the mat loosing its integrity.

A 1 cm thick mat, about 20 cm by 30 cm, was fed between heated rolls of a laminator under the same conditions used in Example 1. After exiting the laminator the mat was flat and had sufficient strength to be easily handled without breaking apart. The mat was then placed against a similar size piece of 500 μm thick PETG and hot rolled under the same conditions. As in Example 2, 25 μm thick polyimide was placed against the hot rolls to prevent the PETG from sticking to the rolls.

The sample was vacuum thermoformed using a female forming die with 2.5 cm by 2.5 cm by 1 cm pockets. The PETG sample was heated in the oven for 25 seconds at 290° C. and thermoformed with the surface of the PETG having the metal fibers facing away from the forming die. The resulting sample had a continuous metal fiber network on the surface including regions in which the PETG/metal fiber composite had been stretched over 200%.

EXAMPLE 4

A metal/polymer composite was prepared as follows: metal alloy fibers (58 wt % bismuth, 42 wt % tin, approximately 75 μm in diameter) were made using three separate conditions. The first batch contained relatively short curly fibers made using a 75 μm nozzle and a pressure of 420 kPa. The second contained very long straight fibers from the same nozzle at 145 kPa pressure. The third batch consisted of short fibers made by bouncing the metal jet off of aluminum foil at 110 kPa and 76 cm from the nozzle, and 345 kPa psi and 99 cm from the nozzle.

Dried pellets of Kodar PETG copolyester 6763, manufactured by Eastman Kodak, were coextruded with a blend of Bynel CXA 1025 and CXA 3101, both manufactured by DuPont, to form a film 0.5 to 0.75 mm thick, approximately 0.25 to 0.375 mm of which was PETG. Low melting metal alloy fibers from each of the three batches above were uniformly distributed by hand on the PETG surface of several pieces (about 15 cm by 75 cm) of the coextruded film. Metal alloy fibers from the different batches were not mixed on a single film. Metal fiber content ranged from about 200 to 600 grams per square meter. The metal fibers were pressed into the PETG surface of the coextruded film in a platen press at a maximum pressure of 896 kPa, with upper and lower platens at 140° C. Pressure was removed after reaching 896 kPa (about 15 seconds).

Subsequent to cooling, the coextruded films containing the embedded metal alloy fibers were attached to 1.5 mm thick substrates of poly(acrylonitrile-butadiene-styrene) (ABS), polycarbonate (PC), poly(vinyl chloride) (PVC) and polypropylene (PP), with the metal fiber layer external and the Bynel CXA blend layer next to the substrate. Attachment was accomplished by feeding the substrate and the film through a rubber roll, hand-crank laminator while applying heat via a hand-held heat gun to the Bynel layer as it entered the rolls and contacted the substrate. The temperature was such that the Bynel layer became tacky.

The composite, comprising a substrate of either PP, ABS, PC or PVC, a Bynel layer, a PETG layer and a random arrangement of metal fibers embedded in a PETG layer, was then thermoformed using a male mold 10 cm by 12 cm by 2 cm high. Metal fibers were on the inside surface next to the mold. Thermoformed samples were tested for electromagnetic shielding effectiveness following a procedure similar to ASTM test ES7-83. Results are summarized in Table 2.

TABLE 2

| NEAR FIELD SHIELDING EFFECTIVENESS (DECIBELS) | | | | |
|---|---|---|---|---|
| SUBSTRATE | 30 MHz | 100 MHz | 300 MHz | 1000 Hz |
| ABS | 44 | 60 | 65 | 54 |
| ABS (highest metal content) | 44 | 62 | 70 | 63 |
| PC (lowest metal content) | 34 | 36 | 37 | 48 |
| PVC | 44 | 57 | 63 | 50 |
| PP | 44 | 56 | 59 | 51 |

What is claimed is:

1. A method of forming a metal/polymer composite comprising the steps of:
   (a) providing a polymeric substrate; and
   (b) squirting at least one fine stream of a molten metal from at least one orifice into an atmosphere;

(c) solidifying said at least one stream as a plurality of metal strands in the atmosphere above said substrate;

(d) collecting said solidified metal strands on the substrate as a loose mat of a randomly intersecting pattern of metal strands; and (e) simultaneously embedding the loose mat into the substrate and sintering the strands of metal together at the points of intersection by passing the substrate and mat between heated rollers under pressure at a temperature less than the melting temperature of said metal.

2. The method of claim 1 wherein said molten metal is squirted from said at least one orifice at a pressure greater than $P_c$.

3. The method of claim 1 wherein said substrate is a thermoformable polymer and said metal having a melting point of less than the thermoforming temperature of said polymeric substrate.

4. The method of claim 1 wherein said strands have a diameter of about 25-100 μm.

5. The method of claim 4 wherein said strands have a diameter of about 25-100 μm.

6. The method of claim 1 wherein said metal is selected from the group consisting of tin, lead, bismuth, cadmium, indium, gallium, mixtures thereof and alloys of said metals containing one or more metals selected from the group consisting of zinc, aluminum, copper, silver, gold, nickel, cobalt, and iron.

7. The method of claim 1 further including the step of thermoforming said composite.

8. The method of claim 7 wherein said composite is stretched in certain regions at least 20% in one direction during thermoforming without losing substantial electromagnetic shielding properties.

9. The method of claim 7 wherein said composite is stretched in certain regions at least 20% in more than one direction during thermoforming without losing substantial electromagnetic shielding properties.

10. A method of forming a metal/polymer composite comprising the steps of:

(a) squirting at least one fine stream of a molten metal from at least one orifice into an atmosphere;

(b) solidifying said at least one stream as a plurality of metal strands in the atmosphere above the substrate;

(c) collecting said solidified metal strands on a support forming a loose mat of a randomly intersecting pattern of metal strands;

(d) passing said loose mat between two heated rollers at a temperature which is less than the melting temperature of the metal thereby sintering the strands of metal together at points of intersection to form a sintered mat; and (e) laminating said sintered mat to a polymeric substrate at a temperature below the melting temperature of said metal.

11. The method of claim 10 wherein said substrate is thermoformable, said metal having a melting point of less than the thermoforming temperature of said polymeric substrate.

* * * * *

UNITED STATES PATENT AND TRADEMARK OFFICE
CERTIFICATE OF CORRECTION

PATENT NO. : 5,226,210
DATED : July 13, 1993
INVENTOR(S) : David C. Koskenmaki, Clyde D. Calhoun, Robert L. Lambert, Jr.

It is certified that error appears in the above-indentified patent and that said Letters Patent is hereby corrected as shown below:

Column 1, Line 53, "charges Metal/Polymer" should read --charges. Metal/polymer--.

Column 1, Line 64, "used in EMI shielding In such EMI" should read --used in EMI shielding. In such EMI--.

Column 8, Line 22, "down The upper" should read --down. The upper--.

Column 11, Line 21, "25-100" should read --10-200--.

Signed and Sealed this

Twenty-first Day of June, 1994

Attest:

BRUCE LEHMAN

*Attesting Officer*    *Commissioner of Patents and Trademarks*